(12) United States Patent
Dierickx

(10) Patent No.: US 11,997,404 B2
(45) Date of Patent: May 28, 2024

(54) SINGLE-ENDED SIGNAL TO DIFFERENTIAL SIGNAL CONVERSION

(71) Applicant: CAELESTE CVBA, Mechelen (BE)

(72) Inventor: Bart Dierickx, Edegem (BE)

(73) Assignee: CAELESTE BV, Mechelen (BE)

( * ) Notice: Subject to any disclaimer, the term of this patent is extended or adjusted under 35 U.S.C. 154(b) by 102 days.

(21) Appl. No.: 17/952,938

(22) Filed: Sep. 26, 2022

(65) Prior Publication Data

US 2024/0107191 A1 Mar. 28, 2024

(51) Int. Cl.
*H04N 25/677* (2023.01)
*H01L 27/146* (2006.01)
*H04N 25/767* (2023.01)
*H04N 25/78* (2023.01)

(52) U.S. Cl.
CPC ..... *H04N 25/677* (2023.01); *H01L 27/14609* (2013.01); *H04N 25/767* (2023.01); *H04N 25/78* (2023.01)

(58) Field of Classification Search
CPC .... H04N 25/677; H04N 25/767; H04N 25/78; H04N 23/80; H04N 25/60; H01L 27/14609
See application file for complete search history.

(56) References Cited

PUBLICATIONS

Kim et al., "A High Full Well Capacity CMOS Image Sensor for Space Applications", Sensors, Mar. 28, 2019, vol. 19, No. 1505, 16 pages.

*Primary Examiner* — Albert H Cutler
(74) *Attorney, Agent, or Firm* — Workman Nydegger

(57) ABSTRACT

A column circuit for single-ended to fully differential conversion includes capacitors for sampling a pixel signal level, and capacitors for sampling a pixel reset level; and switches for connecting capacitors for sampling the pixel signal level and capacitors for sampling the pixel reset level in opposite polarity, thereby realizing symmetrical differential signals on two output nodes. A method is provided for single-ended to fully differential conversion, and a use of the column circuit for single-ended to fully differential conversion.

14 Claims, 7 Drawing Sheets

SINGLE-ENDED SIGNAL TO DIFFERENTIAL SIGNAL CONVERSION

TECHNICAL FIELD OF THE INVENTION

The present invention relates to the field of signal conversion. More specifically, the present invention relates to the conversion of a single-ended signal to a fully differential signal.

BACKGROUND OF THE INVENTION

Classic pixels typically have a single output, on which sequentially two signals appear: a pixel reset level and a pixel signal level. These single-ended pixel signals lack the ability to reject noise caused by, e.g., differences in ground voltage level between transmitting and receiving circuits, or by induction picked up on the wire carrying the output signals. Some, but not all, noise may be rejected by, instead, using a pseudo-differential signal, which is a "differential" signal having two nodes, one of which carries a DC voltage, and the other carries a signal that is, in essence, a single-ended pixel signal. Furthermore, analogue to digital convertors often require fully differential signals, wherein two signals are typically inversed with respect to each other.

A typical convertor for converting such a single-ended pixel signal, outputted by a pixel column, from a pixel output into a fully differential output signal is, for example, disclosed in KIM, Woo-Tae, et al. A high full well capacity CMOS image sensor for space applications. Sensors, 2019, 19.7: 1505. Herein, a pixel signal level may be sampled on a first capacitor and a pixel reset level may be sampled on a second capacitor. Next, the first terminals of the two capacitors are electrically contacted with each other. A signal is tapped from each bottom plate and inputted into a differential feedback amplifier to yield two signals that are the inverse of each other.

There is, thus, still a need in the art for an alternative, simple single-ended to differential convertor, not needing an active feedback circuit, and which may be easily integrated into column circuitry.

SUMMARY OF THE INVENTION

It is an object of the present invention to provide a good column circuit for converting a single-ended (or pseudo-differential) pixel signal, into a fully differential output signal. It is a further object of the present invention to provide a good method for converting a single-ended pixel signal into a fully differential output signal.

The above objectives are accomplished by a method and device according to embodiments of the present invention.

It is an advantage of embodiments of the present invention that good single-ended pixel signal to fully differential signal conversion may be achieved with simple circuitry without amplifiers. It is a further advantage of embodiments of the present invention that circuitry, typically sample and hold stages present inside column circuitry, of image sensors of the state of the art, may be reused for the single-ended to differential conversion. It is, therefore, an advantage of embodiments of the present invention that the incremental space required by the column circuit of the present invention may be small.

It is an advantage of embodiments of the present invention that, as the column circuit for single-ended to differential conversion is located inside a pixel column, and may even be located inside a pixel, of an image sensor, single-ended to differential conversion is performed directly at the beginning of the signal chain. It is, therefore, a further advantage that noise may have a particularly limited effect on the signal of an image sensor comprising the column circuit of embodiments of the present invention. It is a further advantage of the present invention that signal gain may be applied early in the signal chain.

It is an advantage of embodiments of the present invention that the column circuit has an implicit voltage gain of twice the inputted signal. It is a further advantage of embodiments of the present invention that it is straightforward to implement higher factors of voltage gain.

In a first aspect, a column circuit for single-ended to fully differential conversion is provided. The column circuit comprises capacitors for sampling a pixel signal level, and capacitors for sampling a pixel reset level; and switches for connecting capacitors for sampling the pixel signal level and capacitors for sampling the pixel reset level in opposite polarity, thereby realizing symmetrical differential signals on two output nodes.

More specifically, the present invention relates to a column circuit, e.g., a convertor comprised in the circuitry of in a pixel column, for converting a single-ended pixel signal sequentially comprising a pixel signal level and a pixel reset level, into a fully differential output signal. The column circuit comprises, or consists of, a first subcircuit and a second subcircuit, each connected to an input port for sampling the pixel signal level and the pixel reset level. The first subcircuit comprises a first capacitor having a first and a second terminal, for sampling the pixel signal level, and a second capacitor having a first and a second terminal, for sampling the pixel reset level. The first and second capacitors are connected with their first terminal to the input port over a first and a second switch, respectively. The second subcircuit comprises a third capacitor having a first and a second terminal, for sampling the pixel signal level, and a fourth capacitor having a first and a second terminal, for sampling the pixel reset level. The third and fourth capacitors are connected with their first terminal to the input port over a third and fourth switch, respectively. The second terminal of the first capacitor of the first subcircuit is connected to a first output node, and the second terminal of the fourth capacitor of the second subcircuit is connected to a second output node. The first subcircuit comprises a first shunting switch for connecting the first terminal of the first capacitor with the first terminal of the second capacitor. The second subcircuit comprises a second shunting switch for connecting the first terminal of the third capacitor with the first terminal of the fourth capacitor.

It is an advantage of embodiments of the present invention that the column circuit of the present invention makes use of circuitry, in particular capacitors, typically present inside image circuitry of the state of the art, for example, in sample-and-hold circuits of a column of pixels, or a sample-and-hold circuit of a single pixel.

In embodiments, the column circuit comprises, or is connected to, a controller, which may be configured for actuating the first, second, third and fourth switches and the first and second shunting switches such that the signals at the first and second output nodes are representative for the difference between the pixel reset level and the pixel signal level, e.g., the pixel reset level minus the pixel signal level, and the difference between the pixel signal level and the pixel reset level, e.g., the pixel signal level minus the pixel reset level, respectively. In these embodiments, the controller may be located in a column of an image sensor comprising the column circuit. Alternatively, the controller may be located outside of the column.

In embodiments, the second terminal of the first capacitor is switchably connectable to a first reference voltage source or to ground, and the second terminal of the fourth capacitor is switchably connectable to a second reference voltage source or to ground. The first capacitor may be connected to the first reference voltage source while the pixel signal level is being sampled on the first capacitor. The first capacitor may be disconnected from the first reference voltage source while the difference between the pixel reset level and the pixel signal level is being generated at the first output node. The fourth capacitor may be connected to the second reference voltage source while the pixel reset level is being sampled on the fourth capacitor. The fourth capacitor may be disconnected from the second reference voltage source while the difference between the pixel signal level and the pixel reset level is generated at the second output node. It is an advantage of these embodiments that sampling a pixel reset level or a pixel signal level compared to a reference voltage is enabled. In embodiments, the second terminals of the second and third switch are connected to a third and fourth reference voltage source, respectively, or to ground. The signals generated at the first and second output nodes may, thereby, be inverse with respect to each other.

In embodiments, the second terminal of the first capacitor is connected to the first output node over a first buffer amplifier, and the second terminal of the fourth capacitor is connected to the second output node over a second buffer amplifier. It is an advantage of these embodiments that any external circuitry connected to the subcircuit outputs may be prevented from putting a load on the column circuit. Each buffer amplifier may, for example, be a unity gain buffer amplifier, or, if a gain is preferred that is larger than unity, an amplifier having a gain larger than unity may be selected. Alternatively, the first and second buffer amplifier may not be part of the column circuit, but may, for example, be connected to the first and second output node, respectively, located outside of the column.

In embodiments, the first output node may be differentially connected to the second output node. For example, the first output node may be connected to a first input of a differential amplifier, and the second output node may be connected to a second input of the differential amplifier. Such differential amplifier is commonly present in analogue to digital convertors, but may instead be separate therefrom. It is an advantage of such embodiments that correlated double sampling may be achieved, which may reduce noise that is present on the signal, and, hence, may increase the signal-to-noise ratio. Furthermore, for example, the signal outputted from the differential amplifier may be the sum of the signals at the first and second output nodes. Indeed, as the signals at the first and second output nodes may be inversed with respect to each other, the differential connection may result in a doubling of the signal strength.

In embodiments, the first subcircuit comprises a first further capacitor for sampling the pixel signal level, having a first and a second terminal, and a second further capacitor for sampling the pixel reset level, having a first and a second terminal, wherein the first further capacitor is connected with its first terminal to the input port over a first further switch, and the second further capacitor is connected with its first terminal to the input port over a second further switch. In these embodiments, the second subcircuit comprises a third further capacitor for sampling the pixel signal level, having a first and a second terminal, and a fourth further capacitor for sampling the pixel reset level, having a first and a second terminal, wherein the third further capacitor is connected with its first terminal to the input port over a third further switch, and the fourth further capacitor is connected with its first terminal to the input port over a fourth further switch. It is an advantage of these embodiments that correlated multiple sampling is enabled, which may result in a strong increase in the signal-to-noise ratio. Each subcircuit may comprise, in addition, even further capacitors, with corresponding features as the first, second, third, and fourth capacitors, and the further first, second, third, and fourth capacitors.

In embodiments comprising the further capacitors, the first terminal of the first, second, third and fourth capacitor is connected to the first, second, third and fourth further capacitor, respectively, over a first, second, third and fourth further shunting switch, respectively, wherein the second terminal of the first further capacitor is connected to the first output node, and the second terminal of the fourth further capacitor is connected to the second output node. In embodiments comprising the controller, the controller may be configured for actuating the first, second, third and fourth further shunting switch for averaging the signal sampled on the first, second, third and fourth capacitor and the first, second, third and fourth further capacitor, respectively. For each shunting switch, by closing the shunting switch, the signals sampled on the capacitors connected by the shunting switch may be averaged, which may result in an averaging of the signal, and a reduction in the noise, present on the capacitors connecting by the shunting switch. As such, four- or higher fold correlated multiple sampling may be possible in the column circuit. Indeed, even further capacitors may be added on which the pixel signal level or the pixel reset level may be sampled, and that may be shunted, using a shunting switch, with any of the first, second, third and fourth further capacitors. Adding even further capacitors may result in a further reduction in the noise on a signal outputted by the column circuit, compared to the noise that may be present on the inputted pixel signal.

In different embodiments comprising the further capacitors, each of the first, second, third and fourth capacitors and the respective first, second, third and fourth further capacitors, are connectable in series over a first, second, third and fourth series switch, respectively, wherein each of the first, second, third and fourth series switches connects the second terminal of the respective first, second, third and fourth capacitor with the first terminal of the respective first, second, third and fourth further capacitors. In these embodiments, the first capacitor is connected to the first output node over the first further capacitor, and the fourth capacitor is connected to the second output node over the fourth further capacitor. In embodiments comprising the controller, the controller may be configured for actuating the first, second, third and fourth series switches such that the signal sampled on the first, second, third and fourth capacitors and the signal sampled on the respective first, second, third and fourth further capacitors are stacked. In these embodiments, in each subcircuit, multiple pixel signal levels, and multiple pixel reset levels, may be stacked, which may result in a large gain, and, hence, a strong signal at each output node. As such, each subcircuit may comprise two series of serially connected capacitors, wherein a first series is for stacking, e.g., adding, of pixel signal levels sampled on the capacitors in the first series, and a second series is for stacking of pixel reset levels sampled on the capacitors in the second series. Even further capacitors may be added on which the pixel signal level or the pixel reset level may be sampled, and that may be connectable in each series such that a first terminal of a capacitor is connected to a second terminal of a capacitor subsequent in the series. Indeed, each of the two series in each subcircuit may comprise more than two capacitors, wherein more capacitors may result in a further increase of the gain.

In embodiments, the controller is configured for closing the first and third switch during, e.g., at least part of, a period when the pixel signal level is inputted in the input port. The closing of the first switch may be temporally shifted with respect to the closing of the third switch. However, this is not required, and instead, the closing of the first and third switch may, partially or completely, overlap in time. In embodiments, the controller is configured for opening the first and third switch during, e.g., at least part of, a period when the pixel reset level is inputted in the input port. The closing of the second switch may be temporally shifted with respect to the closing of the fourth switch. However, this is not required, and instead, the closing of the second and fourth switch may, partially or completely, overlap in time. In embodiments, the controller is configured for closing the second and fourth switch when the pixel reset level is inputted in the input port. In embodiments, the controller is configured for opening the second and fourth switch when the pixel signal level is inputted in the input port. In embodiments, the controller is configured for closing the first shunting switch when the pixel signal level is sampled on the first capacitor and the pixel reset level is sampled on the second capacitor, so as to generate the difference between the pixel reset level and the pixel signal level at the first output node. In embodiments, the controller is configured for closing the second shunting switch when the pixel signal level is sampled on the third capacitor and the pixel reset level is sampled on the fourth capacitor, so as to generate the difference between the pixel signal level and the pixel reset level at the second output node.

The capacitors may be any suitable type of capacitor known to the person skilled in the art. The capacitors are, typically, capacitors that are present in column circuitry of image sensors of the state of the art. As such, the switches are not limited to a particular type of switch. In particular embodiments, fast switches, such as field effect transistors, may be preferred. In particular when the column circuit of the present invention is located at the end of a column, and sequential processing of the single-ended pixel signal of each pixel in the column is required, a field effect transistor may be advantageous.

Any features of any embodiment of the first aspect may be independently as correspondingly described for any embodiment of any of the other aspects of the present invention.

In a second aspect, the present invention relates to a convertor system. The convertor system comprises at least one column circuit according to embodiments of the first aspect of the present invention. The convertor system further comprises at least one controller, wherein each controller is configured for actuating, for at least one of the at least one column circuit, the first, second, third and fourth switches and the first and second shunting switches such that the signals at the first and second output nodes are representative for the difference between the pixel reset level and the pixel signal level, and the difference between the pixel signal level and the pixel reset level, respectively. In embodiments, the controller may or may not be part of the column circuit.

Any features of any embodiment of the controller of embodiments of the second aspect may be independently as correspondingly described for any embodiment of the controller as described in any of the other aspects of the present invention.

Typically, each column circuit is connected to one of the at least one controller. Each controller may be configured for said actuating for a single column circuit, or for each column circuit of the convertor system.

Any features of any embodiment of the second aspect may be independently as correspondingly described for any embodiment of any of the other aspects of the present invention.

In a third aspect, the present invention relates to an image sensor comprising a plurality of pixel columns, wherein at least one, e.g., each, column comprises at least one column circuit in accordance with embodiments of the first aspect of the present invention. It is an advantage of embodiments of the present invention that, by having a column circuit located in each column, single-ended to differential conversion may be performed early in the signal chain. This may result in reliable generation of a fully differential signal from the "raw" single-ended pixel signal, as directly obtained from the pixel column output.

In embodiments, each pixel column comprises at least one, e.g., a plurality of, pixels. In embodiments, each pixel comprises a column circuit in accordance with embodiments of the present invention. By having a column circuit located in each pixel, single-ended to differential conversion may be performed in parallel for all pixels in a column, providing good efficiency and fast processing of the signals. The simple circuitry of the present invention facilitates the presence of a column circuit in each pixel. Indeed, it is an advantage of embodiments of the present invention that elements of sample and hold circuits that are typically present in column circuitry of pixel arrays or in pixels themselves, may be used for the column circuit of embodiments of the present invention. It is an advantage of embodiments of the present invention that single-ended to differential conversion at the beginning of the signal chain, which may be performed in parallel, may be beneficial compared to a single, fast single-ended to differential convertor at the end of the signal chain.

In embodiments comprising the controller, as described for embodiments of the first and second aspect of the present invention, each column may comprise a separate controller, which may or may not be part of the column circuitry of the column. In embodiments, e.g., embodiments wherein the controller for each column circuit is located outside of the column, a single controller may act as controller for a plurality of, e.g., each, column circuit of the image sensor. In embodiments, each column comprises at least one convertor system in accordance with embodiments of the second aspect of the present invention.

Any features of any embodiment of the third aspect may be independently as correspondingly described for any embodiment of any of the other aspects of the present invention.

In a fourth aspect, the present invention relates to a method for converting, in a pixel readout structure, e.g., in a column circuit, e.g., circuitry located in a pixel column, a single-ended pixel signal sequentially comprising a pixel signal level and a pixel reset level, inputted to an input port, into a fully differential output signal. The method comprises: a. sampling the pixel signal level on a first terminal of a first capacitor and on a first terminal of a third capacitor; b. sampling the pixel reset level on a first terminal of a second capacitor and on a first terminal of a fourth capacitor; c. generating a first output signal from the signals sampled at the first and the second capacitor, by connecting in series the first terminals of the first and second capacitors, and using the voltage at the second terminal of the first capacitor for generating the first output signal representative for the difference between the pixel reset level and the pixel signal level; and d. generating a second output signal from the signals sampled on the third and the fourth capacitor, by connecting in series the first terminals of the third and fourth capacitors, and using the voltage at the second terminal of the fourth capacitor for generating the second output signal representative for the difference between the pixel signal level and the pixel reset level.

In embodiments, sampling the pixel signal level and sampling the pixel reset level is done relative to a reference voltage. This may be done by connecting, in step a, the second terminal of the first capacitor to a first reference voltage source, and by connecting, in step b, the second terminal of the fourth capacitor to a second reference voltage source, wherein each reference voltage source provides the reference voltage. Furthermore, the second terminals of the second and third capacitor may be connected to a third and fourth reference voltage source, respectively, providing the reference voltage. For example, the reference voltage may be 0V, i.e., ground. In these embodiments, the signals at the first and second output node may be inverted with respect to each other.

In embodiments, in step a, the sampling of the pixel signal level on the first capacitor is performed temporally shifted with respect to the sampling of the pixel signal level on the third capacitor, and, in step b, the sampling of the pixel reset level on the second capacitor is performed temporally shifted with respect to the sampling of the pixel reset level on the fourth capacitor. By sampling the pixel signal level and the pixel reset level at different moments in time on the different respective capacitors, two-fold correlated multiple sampling may be performed, so that accuracy may be increased or an error on the fully differential output signals may be reduced. In particular, this may allow to suppress time-dependent noise present on the pixel signals.

In embodiments, in step a, the pixel signal level is sampled on a first further capacitor, temporally shifted with respect to the sampling of the pixel signal level on the first capacitor, and the pixel reset level is sampled on a third further capacitor, temporally shifted with respect to the sampling of the pixel reset level on the third capacitor. In these embodiments, in step b, the pixel reset level is sampled on a second further capacitor, temporally shifted with respect to the sampling of the pixel reset level on the second capacitor, and the pixel reset level is sampled on the fourth further capacitor, temporally shifted with respect to the sampling of the pixel reset level on the fourth capacitor. This enables two-fold correlated multiple sampling, or even four-fold correlated multiple sampling when the signals in the two subcircuits are sampled temporally shifted with respect to each other.

Any features of any embodiment of the fourth aspect may be independently as correspondingly described for any embodiment of any of the other aspects of the present invention.

In a fifth aspect, the present invention relates to a use of the column circuit according to embodiments of the first aspect for converting a single-ended pixel signal sequentially comprising a pixel signal level and a pixel reset level, into a fully differential output signal.

Any features of any embodiment of the fifth aspect may be independently as correspondingly described for any embodiment of any of the other aspects of the present invention.

Particular and preferred aspects of the invention are set out in the accompanying independent and dependent claims. Features from the dependent claims may be combined with features of the independent claims and with features of other dependent claims as appropriate and not merely as explicitly set out in the claims.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

Figure 1:
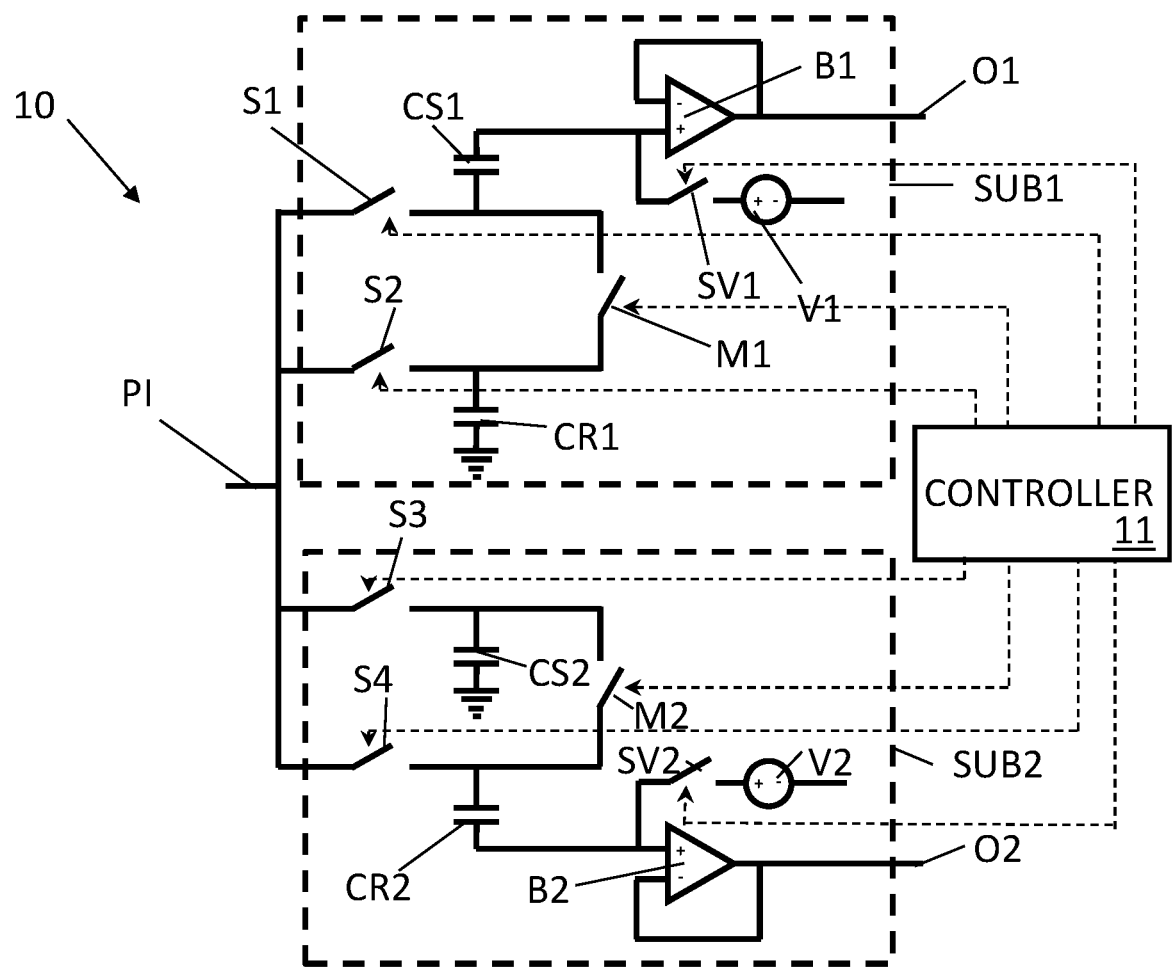
FIG. 1 is a circuit diagram of a first example of a column circuit in accordance with embodiments of the present invention.

In the different figures, the same reference signs refer to the same or analogous elements.

DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. The word "comprising" according to the invention therefore also includes as one embodiment that no further components are present. Thus, the scope of the expression "a device comprising means A and B" should not be interpreted as being limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where, within the scope of the present invention, a single-ended pixel signal is mentioned, reference is made to a signal carried by a single node, sequentially comprising a pixel reset level and a pixel signal level. Where, within the scope of the present invention, a pseudo-differential signal is mentioned, reference is made to a signal carried by two nodes, wherein a first node carries a constant or DC voltage level such as a pixel reset level, and a second node carries an information signal, e.g., reminiscing a single-ended pixel signal sequentially comprising a pixel reset level and a pixel signal level. When reference is made to a single-ended pixel signal that is inputted and/or converted into a fully differential signal, this single-ended pixel signal may be based on, e.g., derived from, a pseudo-differential signal (e.g., may be the difference between the signal on the first node and the signal on the second node, or may be the information signal). In other words, when it is said that the column circuit, e.g., convertor, or method in accordance with embodiments of the present invention is for converting a single-ended pixel signal into a fully differential signal, this may also include conversion of a pseudo-differential signal into a fully differential signal. Where, within the scope of the present invention, a fully-differential signal is mentioned, reference is made to two signals that are inversed with respect to each other.

The invention will now be described by a detailed description of several embodiments of the invention. It is clear that other embodiments of the invention can be configured according to the knowledge of persons skilled in the art without departing from the true spirit or technical teaching of the invention, the invention being limited only by the terms of the appended claims.

In a first aspect, the present invention relates to a column circuit for converting a single-ended pixel signal sequentially comprising a pixel signal level and a pixel reset level, into a fully differential output signal. The column circuit comprises a first subcircuit and a second subcircuit, each connected to an input port for sampling the pixel signal level and the pixel reset level. The first subcircuit comprises a first capacitor having a first and a second terminal, for sampling the pixel signal level, and a second capacitor having a first and a second terminal, for sampling the pixel reset level. The first and second capacitors are connected with their first terminal to the input port over a first and a second switch, respectively. The second subcircuit comprises a third capacitor having a first and a second terminal, for sampling the pixel signal level, and a fourth capacitor having a first and a second terminal, for sampling the pixel reset level. The third and fourth capacitors are connected with their first terminal to the input port over a third and fourth switch, respectively. The second terminal of the first capacitor of the first subcircuit is connected to a first output node, and the second terminal of the fourth capacitor of the second subcircuit is connected to a second output node. The first subcircuit comprises a first shunting switch for connecting the first terminal of the first capacitor with the first terminal of the second capacitor. The second subcircuit comprises a second shunting switch for connecting the first terminal of the third capacitor with the first terminal of the fourth capacitor.

In a second aspect, the present invention relates to a convertor system. The convertor system comprises at least one column circuit according to embodiments of the first aspect of the present invention. The convertor system further comprises at least one controller, wherein each controller is configured for actuating, for at least one of the at least one column circuit, the first, second, third and fourth switches and the first and second shunting switches such that the signals at the first and second output nodes are representative for the difference between the pixel reset level and the pixel signal level, and the difference between the pixel signal level and the pixel reset level, respectively. Herein, the controller may or may not be part of the column circuit.

In another aspect, the present invention relates to a method for converting, in a pixel readout structure, a single-ended pixel signal sequentially comprising a pixel signal level and a pixel reset level, inputted to an input port, into a fully differential output signal. The method comprises: sampling the pixel signal level on a first terminal of a first capacitor and on a first terminal of a third capacitor; sampling the pixel reset level on a first terminal of a second capacitor and on a first terminal of a fourth capacitor; generating a first output signal from the signals sampled at the first and the second capacitor, by connecting in series the first terminals of the first and second capacitors, and using the voltage at the second terminal of the first capacitor for generating the first output signal representative for the difference between the pixel reset level and the pixel signal level; and generating a second output signal from the signals sampled on the third and the fourth capacitor, by connecting in series the first terminals of the third and fourth capacitors, and using the voltage at the second terminal of the fourth capacitor for generating the second output signal representative for the difference between the pixel signal level and the pixel reset level.

Reference is made to FIG. 1, which is a circuit diagram of a first example of a column circuit 10 in accordance with embodiments of the present invention. A single-ended pixel signal, sequentially comprising a pixel signal level and a pixel reset level, is inputted in an input port PI. The pixel signal may originate from a single pixel, in which case the input may, for example, comprise the signal generated by a single photodiode. Alternatively, the pixel signal could originate from a column of pixels, in which case the input may comprise the pixel signal level and the pixel reset level for, sequentially, all pixels of the column. The input port PI may be directly connected to the pixel output, or to the output from the column of pixels. The single-ended pixel signal may be a (raw) signal generated by the pixels, but this is not essential.

In the example illustrated, the column circuit 10 comprises four capacitors CS1, CR1, CS2 and CR2: a first capacitor CS1 for sampling a pixel signal level and a second capacitor CR1 for sampling a pixel reset level, in a first subcircuit SUB1; and a third capacitor CS1 for sampling a pixel signal level, and a fourth capacitor CR2 for sampling a pixel reset level, in a second subcircuit SUB2. Each of the four capacitors CS1, CR1, CS2 and CR2 is connected, with its first terminal, to the input port PI over a respective switch S1, S2, S3 and S4. The second terminal of the first capacitor CS1 is connected, over a first buffer amplifier B1, which is in this example a unity gain buffer amplifier, to a first output node O1 of the first subcircuit SUB1. The second terminal of the fourth capacitor CR2 is connected, over a second buffer amplifier B2, which is in this example a unity gain buffer amplifier B2, to a second output node O2 of the second subcircuit SUB2. The invention is, however, not limited to unity gain buffer amplifiers: for example, a buffer amplifier could be selected that has a gain larger than 1. The second terminal of the first capacitor CS1 is connected, over a first reference voltage switch SV1, to a first reference voltage source V1. Similarly, the second terminal of the fourth capacitor CR2 is connected, over a second reference voltage switch SV2, to a second reference voltage source V2. Although in this example, two separate reference voltage sources V1 and V2 are shown, instead, only a single reference voltage source V1 or V2 could be used, wherein both the second terminal of the first capacitor CS1 and the second terminal of the fourth capacitor CR2 are connectable to said single reference voltage source V1 or V2. Furthermore, both reference voltage sources, or one of both reference voltage sources, could be replaced by ground.

The first terminal of the first capacitor CS1 is connected to the first terminal of the second capacitor CR1 over a first shunting switch M1. The first terminal of the third capacitor CS2 is connected to the first terminal of the fourth capacitor CR2 over a second shunting switch M2. In this example, the second terminal of the second capacitor CR1 and the second terminal of the third capacitor CS2 are connected to ground. Instead, however, a reference voltage source could be used, which may be used to generate a reference voltage different from ground.

Figure 2:
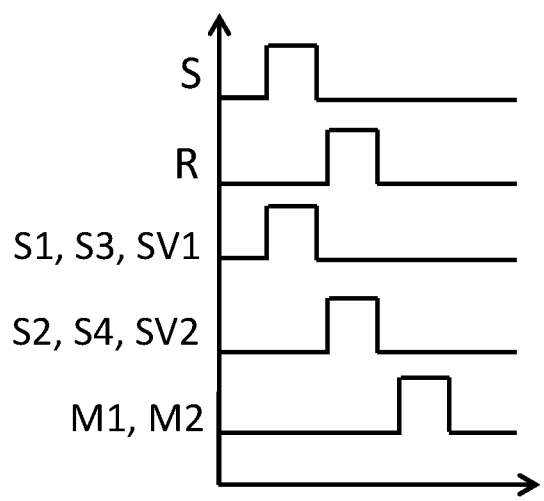
FIG. 2 is an exemplary diagram showing, as a function of time, when the pixel signal level and the pixel reset level are inputted, and a signal, generated by the controller, for closing each of the switches of the column circuit, in accordance with embodiments of the present invention.

A controller 11 is used for actuating the switches of the column circuit 10. FIG. 2 is an exemplary diagram showing, as a function of time, when the pixel signal level S and the pixel reset level R are inputted in the input port PI of the column circuit 10 of FIG. 1: these are inputted when their respective signal is high in FIG. 2. Furthermore, a signal, generated by the controller 11, for closing each of the switches of the column circuit 10 is shown in FIG. 2. When the signal of a switch is high, said switch is closed (i.e., current may pass); when the signal is low, said switch is opened (i.e., current may not pass).

As can be observed in FIG. 2, in this example, when the pixel signal level S is inputted in the input port PI, the first switch S1, the third switch S3, and the first reference voltage switch SV1 are closed. These switches S1, S3 and SV1 are opened when the pixel signal level S is no longer inputted in the input port PI. As a result, the pixel signal level S is sampled on the first capacitor CS1, relative to a first reference voltage generated by the first reference voltage source V1, and on the third capacitor CS2, relative to ground. When, subsequently, the pixel reset level R is inputted in the input port PI, the second switch S2, the fourth switch S4, and the second reference voltage switch SV2 are closed. Next, these switches S2, S4 and SV2 are opened when the pixel reset level R is no longer inputted in the input port PI. As a result, the pixel reset level R is sampled on the second capacitor CR1, relative to ground, and on the fourth capacitor CR2, relative to a second reference voltage generated by the second reference voltage source V2. Subsequently, the first shunting switch M1 and the second shunting switch M2 are closed.

Upon closing of the first shunting switch M1, the first terminal of the first capacitor CS1 and the first terminal of the second capacitor CR1 contact each other. As a result, a signal is generated at the second terminal of the first capacitor CS1 that is representative for the difference between the pixel reset level and the pixel signal level. This signal generated at the second terminal of the first capacitor CS1 is passed through the first buffer amplifier B1 and outputted to the first output node O1. More specifically, the signal generated at the second terminal of the first capacitor CS1, and so a first output signal at the first output node O1, represents: (pixel reset level)−(pixel signal level)−(first reference voltage).

Upon closing of the second shunting switch M2, the first terminal of the third capacitor CS2 and the first terminal of the fourth capacitor CR2 contact each other. As a result, a signal is generated at the second terminal of the fourth capacitor CR2 that is representative for the difference between the pixel signal level and the pixel reset level. This signal generated at the second terminal of the fourth capacitor CR2 is passed through the second buffer amplifier B2 and outputted to the second output node O2. More concretely, the signal generated at the second terminal of the fourth capacitor CR2, and so a second output signal at the second output node O2, represents: (pixel signal level)–(pixel reset level)–(second reference voltage).

When the first and second reference voltage are equal to ground, e.g., 0 V, the first output signal represents (pixel reset level)–(pixel signal level) and the second output signal represents (pixel signal level)–(pixel reset level), so that the first and second output signal are the inverse of one another.

As such, the present invention enables to generate, starting from the single-ended pixel signal inputted in the input port PI, a fully differential signal, comprising the first and second output signal, generated at the first output node O1 and the second output node O2, respectively.

Figure 3:
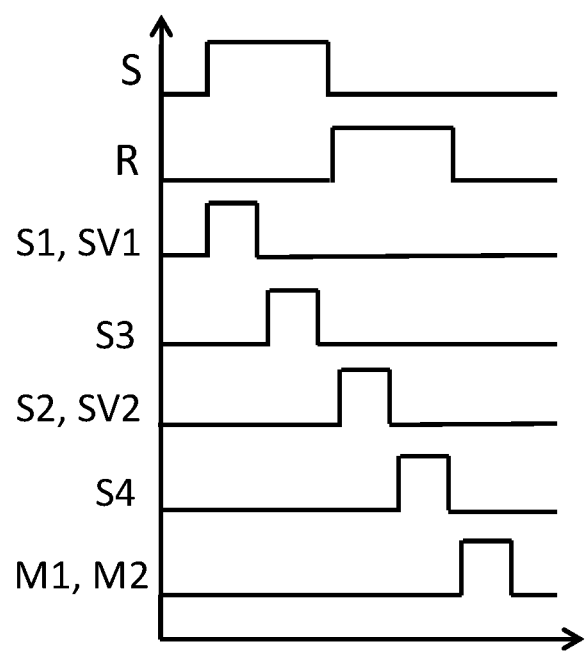
FIG. 3 is a different example of a diagram showing, as a function of time, when the pixel signal level and the pixel reset level are inputted, and a signal, generated by the controller, for closing each of the switches of the column circuit, in accordance with embodiments of the present invention.

FIG. 3 is different example of a diagram showing, as a function of time, when the pixel signal level S and the pixel reset level R are inputted, and furthermore, a signal, generated by the controller 11, for closing each of the switches of the column circuit 10 of FIG. 1. In this example, instead of closing the first switch S1 and the first reference voltage switch SV1, at the same time as the third switch S3, as was done in the example above related to FIG. 2, in this example, the closing of the first switch S1 and the first reference voltage switch SV1, is temporally shifted with respect to closing of the third switch S3. In this example, each of the first capacitor CS1 and the third capacitor CS2 sample a different part of the inputted pixel signal level S. Similarly, instead of closing the second switch S2, at the same time as the fourth switch S4 and the second reference voltage switch SV2, as was done in the example of FIG. 2, instead, in this example, the closing of the second switch S2, is temporally shifted with respect to closing of the fourth switch S4 and the second reference voltage switch SV1. As such, in this example, each of the second capacitor CR1 and the fourth capacitor CR2 sample a different part of the inputted pixel signal level R. After said sampling of the pixel reset level and the pixel signal level in the column circuit 10, the shunting switches M1 and M2 are closed. Although M1 and M2 are, in this example, shown to be closed at the same time, closing of M1 and M2 may, instead, be temporally shifted with respect to each other. However, faster operation may be expected to be achieved when M1 and M2 are closed at the same time. As a result, and similarly as in the previous example, the signals at the first output node O1 and at the second output node O2 are representative for the difference between the pixel reset level R and the pixel signal level S, and the difference between the pixel signal level S and the pixel reset level R, respectively. It is an advantage, however, that by sampling, for each of the pixel signal level and the pixel reset level, the signal on different capacitors, inputted at slightly displaced time moments, the signal at the output nodes O1 and O2 is an average of multiple independent samples. Thereby, the noise, that may vary with time, and that was present in the signal at the input port PI, may be suppressed.

Figure 4:
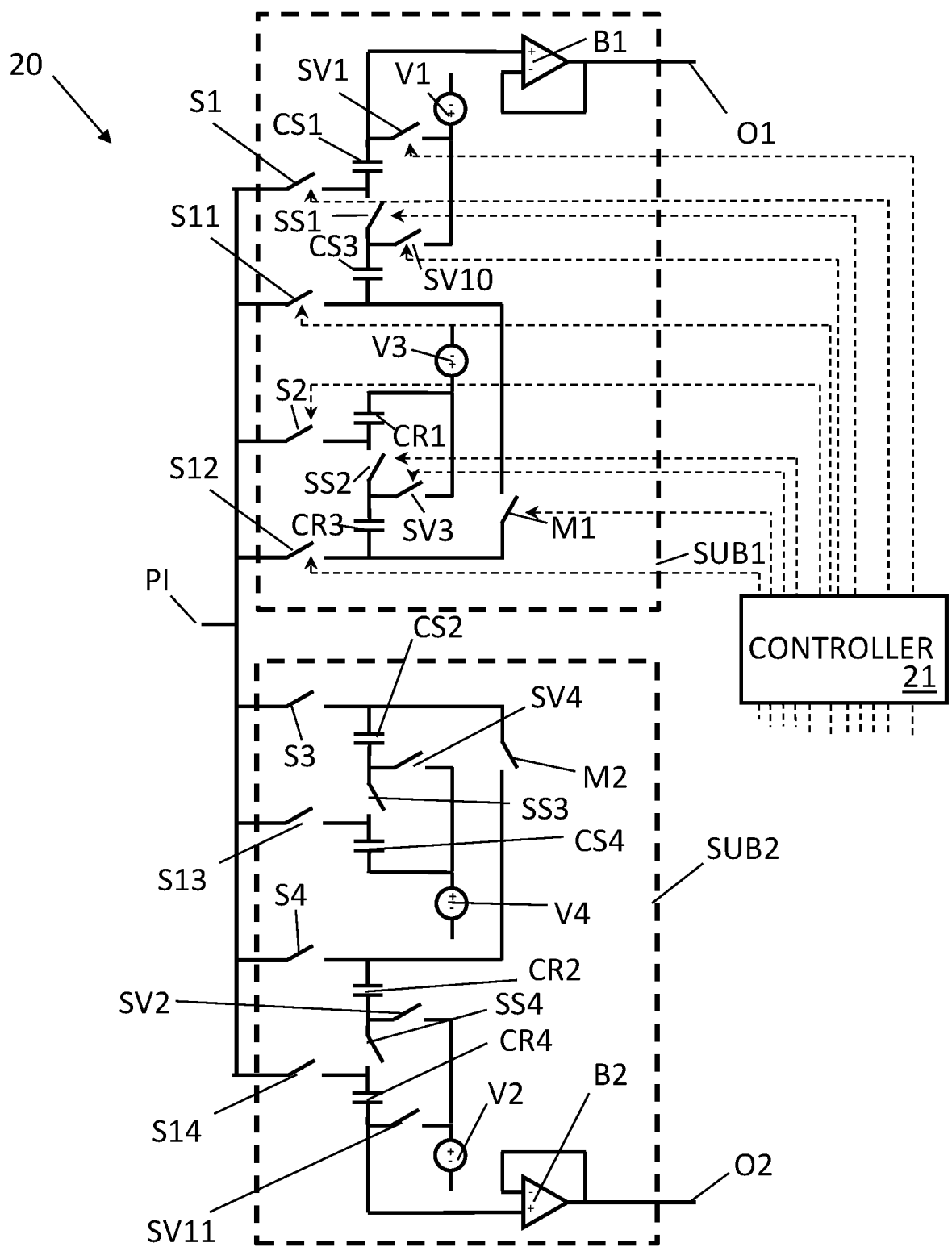
FIG. 4 is a circuit diagram of a second example of a column circuit in accordance with embodiments of the present invention.

Reference is made to FIG. 4, which is a circuit diagram of a second example of a column circuit 20 in accordance with embodiments of the present invention. Similar as in the first example, the column circuit 20 of the second example comprises four capacitors CS1, CR1, CS2 and CR2 connected with their first terminals to an input port PI over respective switches S1, S2, S3 and S4.

In addition, in this example, the first subcircuit SUB1 comprises a first further capacitor CS3 for sampling a pixel signal level, of which a first terminal is connected to the input port PI over a first further switch S11, and a second further capacitor CR3 for sampling a pixel reset level, of which a first terminal is connected to the input port PI over a second further switch S12. Furthermore, in this example, the second subcircuit SUB2 comprises a third further capacitor CS4 for sampling a pixel signal level, of which a first terminal is connected to the input port PI over a third further switch S13, and a fourth further capacitor CR4 for sampling a pixel reset level, of which a first terminal is connected to the input port PI over a fourth further switch S14.

The second terminal of the first capacitor CS1 is connected to a first reference voltage source V1 over a first reference voltage switch SV1. The second terminal of the first further capacitor CS3 is connected to the same first reference voltage source V1, but over a first further reference voltage switch SV10. Also the second terminal of the fourth capacitor CR2 is connected to a second reference voltage source V2 over a second reference voltage switch SV2, and the second terminal of the fourth further capacitor CR4 is connected to the same second reference voltage source V2, but over a second further reference voltage switch SV11.

In this example, a second terminal of the second capacitor CR1 is directly connected to a third reference voltage source V3. Alternatively, the connection could be via a switch. A second terminal of the second further capacitor CR3 is connected to said third reference voltage source V3, over a third further reference voltage switch SV3. Furthermore, a second terminal of the third capacitor CS2 is connected to a fourth reference voltage source V4 over a fourth reference voltage switch SV4. A second terminal of the third further capacitor CS4 is, in this example, directly—or, alternatively, via a switch—connected to said fourth reference voltage source V4. Alternatively, separate reference voltage sources could have been used, one for each capacitor, or, still alternatively, all reference voltages sources V1, V2, V3 and V4 could be replaced by a single reference voltage source V1, V2, V3 or V4, with which the second terminal of each of the capacitors may be connected or connectable (i.e., connected over a switch).

In this example, a second terminal of the first further capacitor CS3 is connected to the first terminal of the first capacitor CS1 over a first series switch SS1. A second terminal of the second further capacitor CR3 is connected to the first terminal of the second capacitor CR1 over a second series switch SS2. The second terminal of the third capacitor CS2 is connected to the first terminal of the third further capacitor CS4 over a third series switch SS3. The second terminal of the fourth capacitor CR2 is connected to the first terminal of the fourth further capacitor CR4 over a fourth series switch SS4. The presence of the connections over the series switches SS1, SS2, SS3 and SS4 allow for stacking of signals sampled on the capacitors they respectively connect, which enables generating large output signals at the first output node O1 and the second output node O2.

Figure 5:
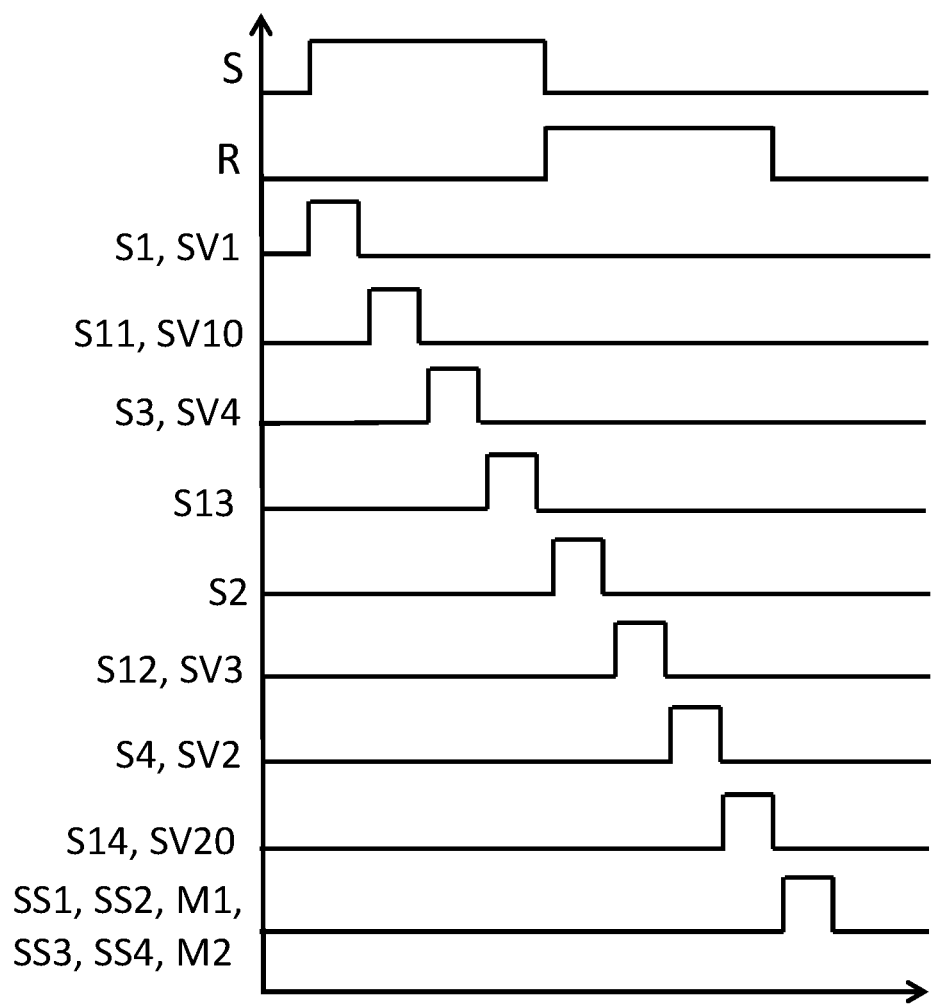
FIG. 5 is an exemplary diagram showing, as a function of time, when the pixel signal level S and the pixel reset level R are inputted, and a signal, generated by the controller, for closing each of the switches of the column circuit of FIG. 4, in accordance with embodiments of the present invention.

FIG. 5 is an exemplary diagram showing, as a function of time, when the pixel signal level S and the pixel reset level R are inputted, and furthermore, a signal, generated by the controller 21, for closing each of the switches of the column circuit 20 of FIG. 4. In this example, when the pixel signal level S is inputted in the input port of the column circuit 20 of FIG. 4, the following steps are executed:

the first switch S1 and the first reference voltage switch SV1 are closed; this way a first part of the pixel signal level is sampled on the first capacitor CS1; thereafter, these switches are opened again;

the first further switch S11 and the first further reference voltage switch SV10 are closed; this way a second part of the pixel signal level is sampled on the first further capacitor CS3; thereafter, these switches are opened again;

the third switch S3 and the third reference voltage switch S4 are closed; this way a third part of the pixel signal level is sampled on the third capacitor CS2; thereafter, these switches are opened again; and the third further switch S13 is closed; this way a fourth part of the pixel signal level is sampled on the third further capacitor CS4; thereafter, this switch is opened again.

Thus, as a result, in each case, a different part of the pixel signal level is sampled on each of the first capacitor CS1 and the first further capacitor CS3, relative to a first reference voltage generated by the first reference voltage source V1, and on the third capacitor CS2 and the third further capacitor CS4, relative to a fourth reference voltage generated by the fourth reference voltage source V4. The order of closure of the switches is not crucial and can be switched; however, in the embodiment illustrated the groups of switches are opened/closed together as indicated. For instance: the first switch S1 and the first reference voltage switch SV1 are closed together, and separately from the closure of the other switches, but not necessarily in the first place in the sequence when the pixel signal level S is inputted in the input port PI of the column circuit 20. This allows to sample temporally shifted signals on the plurality of capacitors.

Similarly, when the pixel reset level R is inputted in the input port PI of the column circuit 20 of FIG. 4, the following steps are executed:

firstly, the second switch S2 is closed; this way a first part of the pixel reset level is sampled on the second capacitor CR1; thereafter, this switch is opened again;

secondly, the second further switch S12 and the third reference voltage switch SV3 are closed; this way a second part of the pixel reset level is sampled on the second further capacitor CR3; thereafter, these switches are opened again;

thirdly, the fourth switch S4 and the second reference voltage switch SV2 are closed; this way a third part of the pixel reset level is sampled on the fourth capacitor CR2; thereafter, these switches are opened again; and fourthly, the fourth further switch S14 and the second further reference voltage switch SV11 are closed; this way a fourth part of the pixel reset level is sampled on the fourth further capacitor CR4; thereafter, these switches are opened again.

Thus, as a result, in each case, a different part of the pixel reset level is sampled on each of the second capacitor CR1 and the second further capacitor CR3, relative to a third reference voltage generated by the third reference voltage source V3, and on the fourth capacitor CR2 and the fourth further capacitor CR4, relative to a fourth reference voltage generated by the fourth reference voltage source V4. Again, the order of closure of the switches is not crucial and can be switched; however, in the embodiment illustrated the groups of switches are opened/closed together as indicated. For instance: the fourth switch S4 and the second reference voltage switch SV2 are closed together, and separately from the closure of the other switches, but not necessarily in the third place in the sequence when the pixel reset level R is inputted in the input port PI of the column circuit 20. This allows to sample temporally shifted signals on the plurality of capacitors.

Although in this example, the pixel signal levels are sampled temporally shifted with respect to each other on the different capacitors CS1, CS2, CS3 and CS4 for sampling the pixel signal level, and the pixel reset levels are sampled temporally shifted with respect to each other on the different capacitors CR1, CR2, CR3 and CR4 for sampling the pixel reset level, this is only an example, and instead, very different schemes may be envisaged. For example, instead, the same part of, e.g., the complete, pixel signal level could be sampled on each of the capacitors CS1, CS2, CS3 and CS4 for sampling the pixel signal level, and the same part of, e.g., the complete, pixel reset level could be sampled on each of the capacitors CR1, CR2, CR3 and CR4 for sampling the pixel reset level. Still alternatively, a first part of the pixel signal level S could be sampled on the first capacitor CS1 and the third capacitor CS2, and a second part of the pixel signal level S could be sampled on the first further capacitor CS3 and the third further capacitor CS4. Sampling different parts, as used in the example, is, however, preferred, because of the strong decrease in noise present on the single-ended pixel signal inputted on in input port PI that may be achieved.

Once the pixel signal level and the pixel reset level are sampled on the respective capacitors, the series switches SS1, SS2, SS3 and SS4 are closed, so that the signal on the two capacitors that each of the series switches SS1, SS2, SS3 and SS4 connects, are stacked. At the same time, the shunting switches M1 and M2 are closed. The stacking in this example results in a doubling of the signal at the output nodes O1 and O2, compared to a situation wherein stacking is not performed, e.g., in the first example illustrated in FIG. 1 and described hereinabove.

Specifically, a first output signal is generated at the first output node O1, representing: (2×pixel reset level)−(2×third reference voltage)−(2×pixel signal level)+(2×first reference voltage). At the same time, a second output signal is generated at the second output node O2, representing: (2×pixel signal level)−(2×fourth reference voltage)−(2×pixel reset level)+(2×second reference voltage). Therefore, when ignoring the reference voltages (that may be ground, i.e., 0V, or a voltage different from 0V), this configuration results in output signals at the output nodes O1 and O2 that are double that of the column circuit of the first example.

Figure 6:
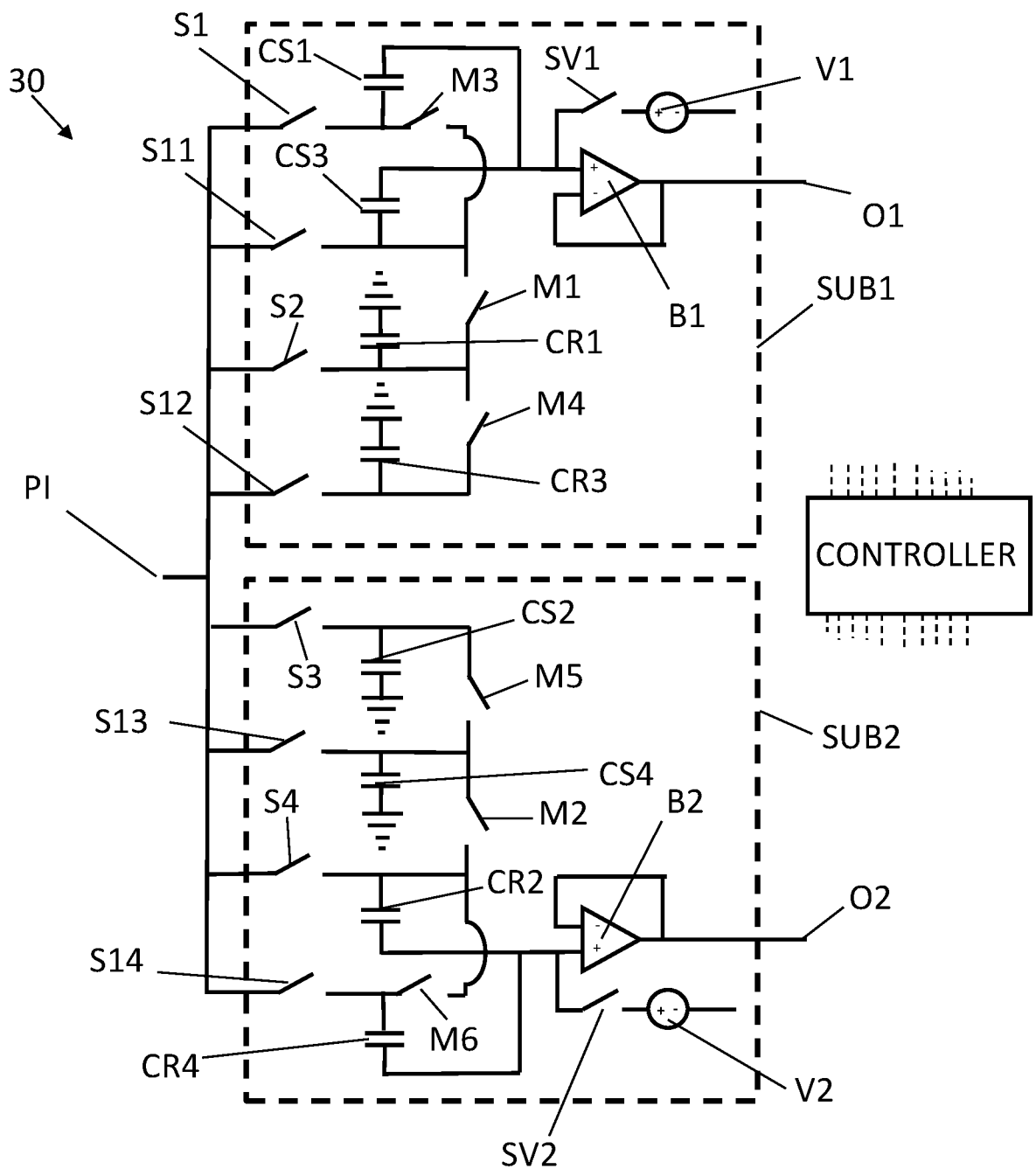
FIG. 6 is a circuit diagram of a third example of a column circuit in accordance with embodiments of the present invention.

Reference is made to FIG. 6, which is a circuit diagram of a third example of a column circuit 30 in accordance with embodiments of the present invention. In this example, a first subcircuit SUB1 comprises a first capacitor CS1 and second capacitor CR1, and a first further capacitor CS3 and a second further capacitor CR3, each connected, with their first terminal, to input port PI over a first switch S1, a second switch S2, a first further switch S11, and a second further switch S12, respectively. The second terminal of the first capacitor CS1 and of the first further capacitor CS3 are connected, over a first reference voltage switch SV1, to a first reference voltage source V1, and, over a common first buffer amplifier B1, to a first output node O1. The second terminal of the second capacitor CR1 and the second further capacitor CR3 are connected to ground. Instead of ground, however, another reference voltage source could be used. Furthermore, the first terminals of the capacitors CS1, CS3, CR1 and CR3 of the first subcircuit SUB1 are connected to each other over a first shunting switch M1, a first further shunting switch M3, and a second further shunting switch M4, for shunting the first terminals of these capacitors of the first subcircuit SUB1.

Similarly, a second subcircuit SUB2 comprises a third capacitor CS2 and a fourth capacitor CR2, and a third further capacitor CS4 and fourth further capacitor CR4, each connected, with their first terminal, to input port PI over a third switch S3, a fourth switch S4, a third further switch S13, and fourth further switch S14, respectively. The second terminal of the third capacitor CS2 and the third further capacitor CS4 are connected to ground. The second terminal of the fourth capacitor CR2 and of the fourth further capacitor CR4 are connected, over a second reference voltage switch SV2, to a second reference voltage source V2, and, over a common second buffer amplifier B2, to a second output node O2. Furthermore, the first terminals of the capacitors CS2, CS4, CR2 and CR4 of the second subcircuit SUB2 are connected to each other over a second shunting switch M2, a third further shunting switch M5 and a fourth further shunting switch M6, for shunting the first terminals of these capacitors of the second subcircuit SUB2.

Hence, although both the column circuit of FIGS. 4 and 6 have four capacitors in each of the two subcircuits SUB1 and SUB2, the way in which each capacitor and respective further capacitor are connected is different. That is, where in FIG. 4, each capacitor is connected with its respective further capacitor in series, resulting in stacking of the signals, in FIG. 6, the signals are averaged. The latter may result in a further increase in the signal-to-noise ratio.

Figure 7:
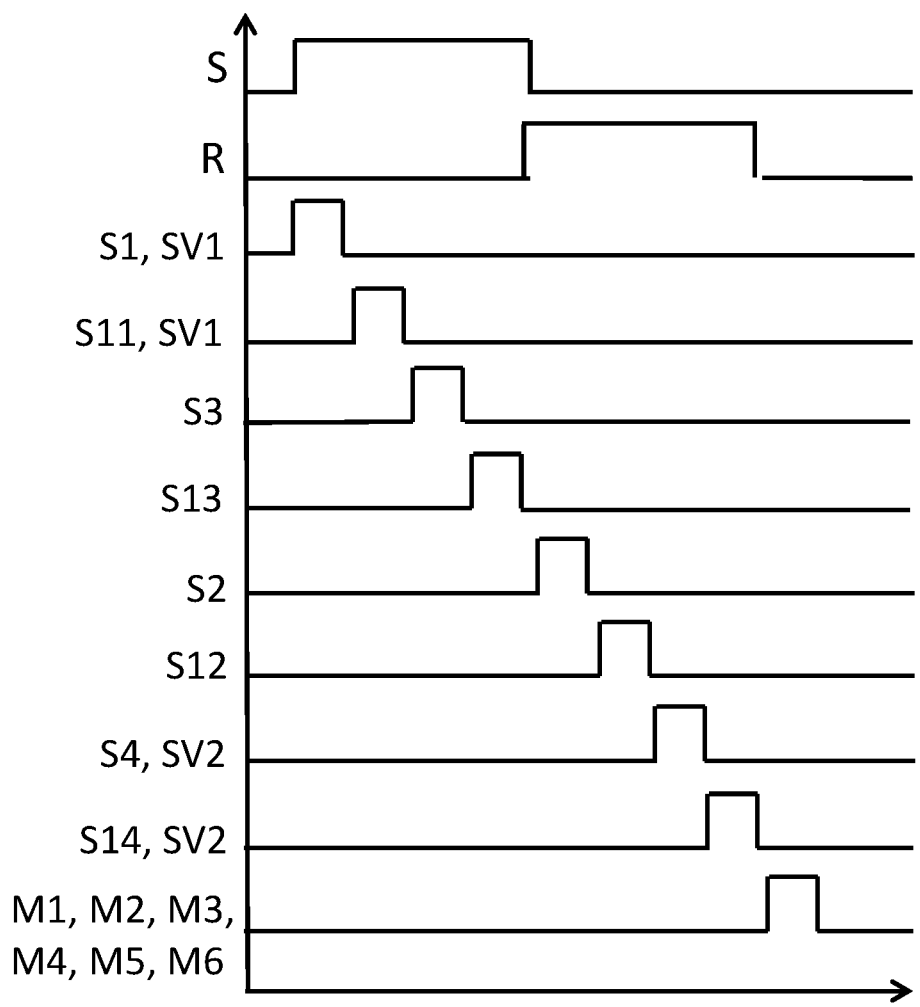
FIG. 7 is an exemplary diagram showing, as a function of time, when the pixel signal level S and the pixel reset level R are inputted, and a signal, generated by the controller, for closing each of the switches of the column circuit of FIG. 6, in accordance with embodiments of the present invention.

FIG. 7 is an exemplary diagram showing, as a function of time, when the pixel signal level S and the pixel reset level R are inputted, and furthermore, a signal, generated by the controller, for closing each of the switches of the column circuit of FIG. 6. As in FIG. 5, which is such a diagram for the column circuit of FIG. 4, the signal S and pixel reset levels R are sampled, temporally shifted on the respective capacitors, although the invention is not limited thereto. After sampling of the signals on the capacitors, the shunting switches M1, M2, M3, M4, M5 and M6 may be closed, thereby generating the signals at the first O1 and second output node O2 that are representative for the difference between the pixel reset level and the pixel signal level, and the difference between the pixel signal level and the pixel reset level, respectively.

Although FIG. 5 and FIG. 7 are presented here above and in the figures as separate concepts, namely a first concept (FIG. 5) wherein signals of corresponding capacitors in each subcircuit are stacked and a second concept (FIG. 7) wherein signals of corresponding capacitors in each subcircuit are averaged, the person skilled in the art will realize that the first and second concept may also be combined. This may result in a column circuit having the advantages of both concepts.

The inventors performed simulations on embodiments of the present invention using Tanner T-Spice software. Now follows an exemplary set of simulations that were performed on the circuit of FIG. 1, except that, instead of the first capacitor CS1 and the second capacitor CR1 being connected to ground as in FIG. 1, in the simulations, they were connected to a non-ground reference voltage.

Figure 8:
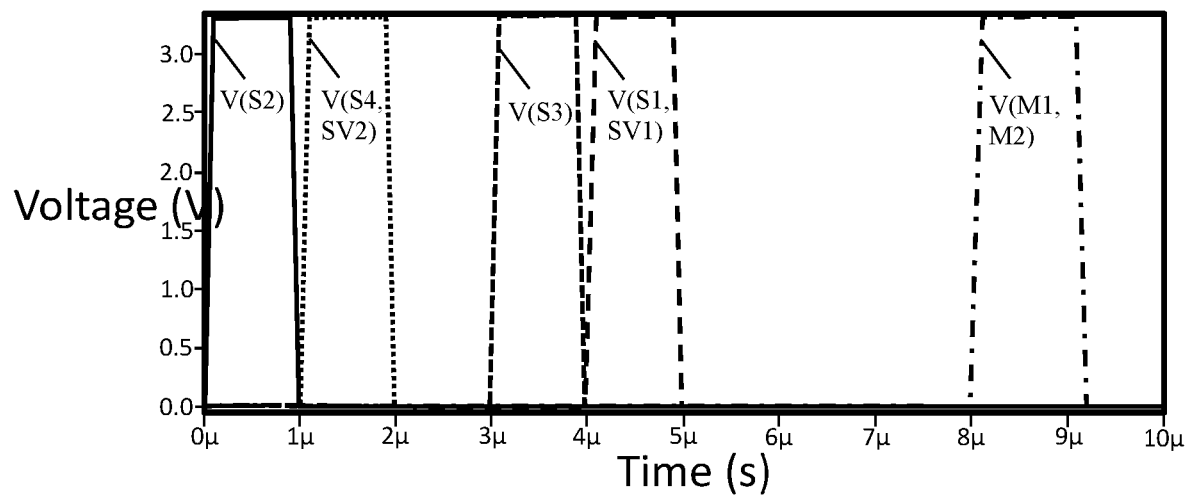
FIG. 8 is a plot of voltages applied in an exemplary set of simulations for closing switches of a column circuit in accordance with embodiments of the present invention.
Figure 9:
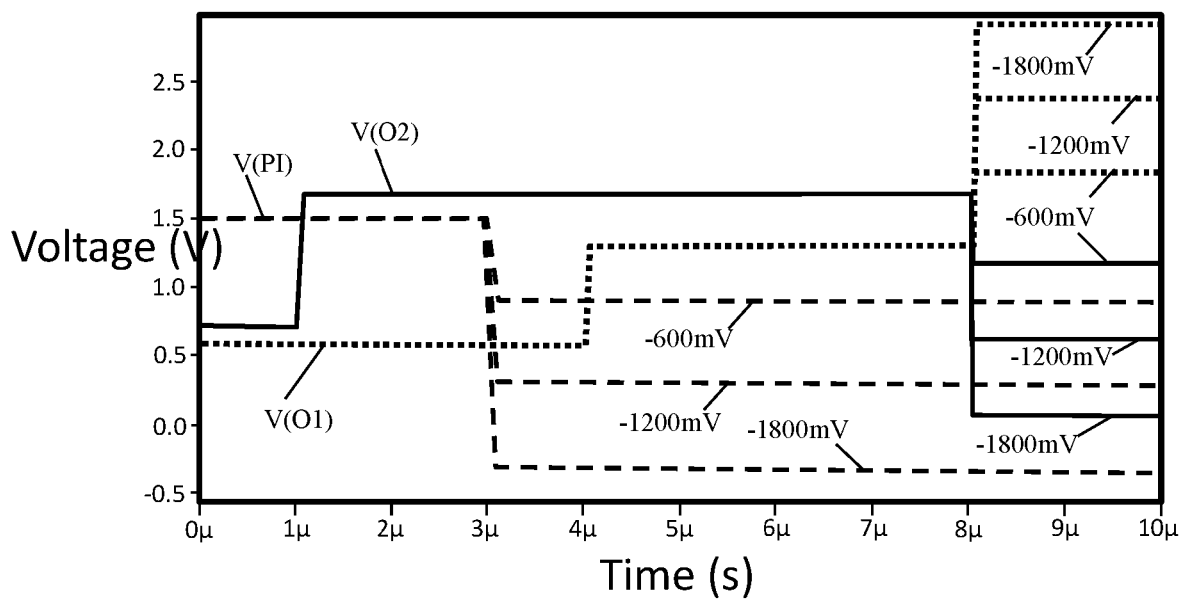
FIG. 9 is a plot of voltages at different nodes of a column circuit during the exemplary set of simulations in accordance with embodiments of the present invention.

FIG. 8 shows a scheme of voltages applied to the switches of the circuit of the simulations, as a function of time, for closing (during a period that the voltage is applied), and subsequently opening, the switches. FIG. 9 shows voltages, obtained from the simulations, at each of three nodes, namely at the input port PI, at the first output node O1 and at the second output node O2.

As may be observed in FIG. 9, at the input port PI, from 0 µs to 3 µs, a pixel reset level of 1500 mV is inputted. As may be observed in FIG. 8, from 0 µs to 1 µs, a voltage is applied so as to close the second switch S2, so that the pixel reset level is stored on the second capacitor CR1. Next, from 1 µs to 2 µs, a voltage is applied so as to close the fourth switch S4 so that the pixel reset level is stored on the fourth capacitor CR2. At the same time, from 1 µs to 2 µs, the second reference voltage switch SV2 is closed: thereby, as can be observed in FIG. 9, the second output node O2 assumes, at 1 µs, the voltage of the second reference voltage source V2.

From 3 µs onwards, a pixel signal level is inputted at the input port PI: simulations for three different pixel signal levels are shown, which are, relative to the pixel reset level, −600 mV, −1200 mV, and −1800 mV, as indicated in FIG. 9. As may be observed in FIG. 8, from 3 µs to 4 µs, a voltage is applied so as to close the third switch S3, whereby the pixel signal level is stored on the third capacitor CS2. Next, from 4 µs to 5 µs, a voltage is applied so as to close the first switch S1 so that the pixel signal level is stored on the first capacitor CS1. At the same time, from 4 µs to 5 µs, the first reference voltage switch SV1 is closed, which, as may be observed in FIG. 9, results in the first output node O1 assuming, at 4 µs, the voltage of the first reference voltage source V1.

Finally, in this exemplary set of simulations, from 8 µs to 9.2 µs, the first shunting switch M1 and the second shunting switch M2 are closed. In FIG. 9, the output signals, at the first output node O1 and at the second output node O2, for the three different simulations are indicated. It may be observed from the results of the simulation that, as expected, with lower pixel level signal, i.e., with increasing magnitude of the pixel signal level relative to the pixel reset level, inputted in the input port PI, the signal at the first output node, which is a signal representative for the pixel reset level minus the pixel signal level, increases, and the signal at the second output node, which is a signal representative for the pixel signal level minus the pixel reset level, decreases.

It is to be understood that although preferred embodiments, specific constructions and configurations, as well as materials, have been discussed herein for devices according to the present invention, various changes or modifications in form and detail may be made without departing from the scope of this invention. Steps may be added or deleted to methods described within the scope of the present invention.

The invention claimed is:

1. A column circuit for converting a single-ended pixel signal sequentially comprising a pixel signal level and a pixel reset level, into a fully differential output signal, the column circuit comprising:

a first subcircuit connected to an input port for sampling the pixel signal level and the pixel reset level, the first subcircuit comprising a first capacitor having a first and a second terminal, for sampling the pixel signal level, and a second capacitor having a first and a second terminal, for sampling the pixel reset level, the first and second capacitors being connected with their first terminal to the input port over a first and a second switch, respectively, a second subcircuit connected to the input port, the second subcircuit comprising a third capacitor having a first and a second terminal, for sampling the pixel signal level, and a fourth capacitor having a first and a second terminal, for sampling the pixel reset level, the third and fourth capacitors being connected with their first terminal to the input port over a third and fourth switch, respectively, the second terminal of the first capacitor of the first subcircuit being connected to a first output node, and the second terminal of the fourth capacitor of the second subcircuit being connected to a second output node, and the first subcircuit comprising a first shunting switch for connecting the first terminal of the first capacitor with the first terminal of the second capacitor, and the second subcircuit comprising a second shunting switch for connecting the first terminal of the third capacitor with the first terminal of the fourth capacitor.

2. The column circuit according to claim 1, wherein the second terminal of the first capacitor is switchably connectable to a first reference voltage source, and wherein the second terminal of the fourth capacitor is switchably connectable to a second reference voltage source.

3. The column circuit according to claim 1, wherein the second terminal of the first capacitor is connected to the first output node over a first buffer amplifier, and wherein the second terminal of the fourth capacitor is connected to the second output node over a second buffer amplifier.

4. The column circuit according to claim 1, wherein the first output node is differentially connected to the second output node.

5. The column circuit according to claim 1, wherein the first subcircuit comprises a first further capacitor for sampling the pixel signal level, having a first and a second terminal, and a second further capacitor for sampling the pixel reset level, having a first and a second terminal, wherein the first further capacitor is connected with its first terminal to the input port over a first further switch, and the second further capacitor is connected with its first terminal to the input port over a second further switch, and wherein the second subcircuit comprises a third further capacitor for sampling the pixel signal level, having a first and a second terminal, and a fourth further capacitor for sampling the pixel reset level, having a first and a second terminal, wherein the third further capacitor is connected with its first terminal to the input port over a third further switch, and the fourth further capacitor is connected with its first terminal to the input port over a fourth further switch.

6. The column circuit according to claim 5, wherein the first terminal of the first, second, third and fourth capacitor is connected to the first, second, third and fourth further capacitor, respectively, over a first, second, third and fourth further shunting switch, respectively, and wherein the second terminal of the first further capacitor is connected to the first output node, and the second terminal of the fourth further capacitor is connected to the second output node.

7. The column circuit according to claim 5, wherein each of the first, second, third and fourth capacitor and the respective first, second, third and fourth further capacitor, are connectable in series over a first, second, third and fourth series switch, respectively, wherein each of the first, second, third and fourth series switches connects the second terminal of the respective first, second, third and fourth capacitor with the first terminal of the respective first, second, third and fourth further capacitor, and wherein the first capacitor is connected to the first output node over the first further capacitor, and wherein the fourth capacitor is connected to the second output node over the fourth further capacitor.

8. A convertor system, comprising:
at least one column circuit according to claim 1, and
at least one controller, wherein each controller is configured for actuating, for at least one of the at least one column circuit, the first, second, third and fourth switches and the first and second shunting switches such that the signals at the first and second output nodes are representative for the difference between the pixel reset level and the pixel signal level, and the difference between the pixel signal level and the pixel reset level, respectively.

9. An image sensor comprising a plurality of pixel columns, wherein at least one column comprises at least one column circuit according to claim 1.

10. The image sensor according to claim 9, wherein each pixel comprises a column circuit.

11. A method for converting, in a pixel readout structure, a single-ended pixel signal sequentially comprising a pixel signal level and a pixel reset level, inputted to an input port, into a fully differential output signal, the method comprising:

a. sampling the pixel signal level on a first terminal of a first capacitor and on a first terminal of a third capacitor, b. sampling the pixel reset level on a first terminal of a second capacitor and on a first terminal of a fourth capacitor, c. generating a first output signal from the signals sampled at the first and the second capacitor, by connecting in series the first terminals of the first and second capacitors, and using the voltage at the second terminal of the first capacitor for generating the first output signal representative for the difference between the pixel reset level and the pixel signal level, and d. generating a second output signal from the signals sampled at the third and the fourth capacitor, by connecting in series the first terminals of the third and fourth capacitors, and using the voltage at the second terminal of the fourth capacitor for generating the second output signal representative for the difference between the pixel signal level and the pixel reset level.

12. The method according to claim 11, wherein sampling the pixel signal level and sampling the pixel reset level is done relative to a reference voltage.

13. The method according to claim 11, wherein, in step a, the sampling of the pixel signal level on the first capacitor is performed temporally shifted with respect to the sampling the pixel signal level on the third capacitor, and wherein, in step b, the sampling of the pixel reset level on the second capacitor is performed temporally shifted with respect to the sampling the reset level on the fourth capacitor.

14. The method according to claim 11, wherein, in step a, the pixel signal level is sampled on a first further capacitor, temporally shifted with respect to the sampling of the pixel signal level on the first capacitor, and the pixel reset level is sampled on a third further capacitor, temporally shifted with respect to the sampling of the pixel reset level on the third capacitor, and wherein, in step b, the pixel reset level is sampled on a second further capacitor, temporally shifted with respect to the sampling of the pixel reset level on the second capacitor, and the pixel reset level is sampled on the fourth further capacitor, temporally shifted with respect to the sampling of the pixel reset level on the fourth capacitor.

* * * * *